United States Patent [19]

Katayama et al.

[11] Patent Number: 5,336,634

[45] Date of Patent: Aug. 9, 1994

[54] DIELECTRICALLY ISOLATED SUBSTRATE AND A PROCESS FOR PRODUCING THE SAME

[75] Inventors: Masatake Katayama, Takasaki; Makoto Sato, Maebashi; Yutaka Ohta, Annaka; Mitsuru Sugita, Fukushima; Konomu Ohki, Annaka, all of Japan

[73] Assignee: Shin-Etsu Handotui Co., Ltd., Chiyoda, Japan

[21] Appl. No.: 25,256

[22] Filed: Mar. 2, 1993

Related U.S. Application Data

[62] Division of Ser. No. 762,990, Sep. 20, 1991, abandoned.

[30] Foreign Application Priority Data

Nov. 16, 1990 [JP] Japan .................................. 2-310723

[51] Int. Cl.⁵ ............................................. H01L 21/76
[52] U.S. Cl. ........................................ 437/63; 437/67; 437/62; 437/64; 437/974; 148/DIG. 50; 148/DIG. 12
[58] Field of Search ............... 148/DIG. 50, DIG. 12; 437/62, 63, 64, 67, 974

[56] References Cited

U.S. PATENT DOCUMENTS

| | | | |
|---|---|---|---|
| 3,780,426 | 12/1973 | Ono et al. | 357/49 |
| 4,131,910 | 12/1978 | Hartman et al. | 357/49 |
| 4,140,558 | 2/1979 | Murphy et al. | 437/67 |
| 4,238,762 | 12/1980 | McWilliams et al. | 357/49 |
| 4,878,957 | 11/1989 | Yamaguchi et al. | 437/974 |
| 4,984,052 | 1/1991 | Koshino et al. | 357/49 |

FOREIGN PATENT DOCUMENTS

0192751 8/1991 Japan ...................................... 437/62

*Primary Examiner*—Tom Thomas
*Assistant Examiner*—Trung Dang
*Attorney, Agent, or Firm*—Nikaido, Marmelstein, Murray & Oram

[57] ABSTRACT

A dielectrically isolated substrate is comprised of a single-crystal silicon substrate or bond substrate and a single-crystal silicon substrate or base substrate bonded together into a composite structure. The bond substrate has a (110) plane as a main crystal plane and is provided with vertically walled moats and substantially squared islands positioned adjacent to the moats. The moats and islands result from anisotropic etching using a specific mask pattern. Also disclosed is a process for producing the composite structure.

5 Claims, 10 Drawing Sheets

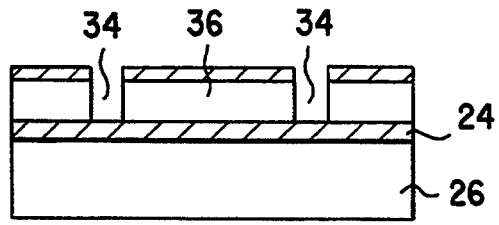
FIG.I(f)
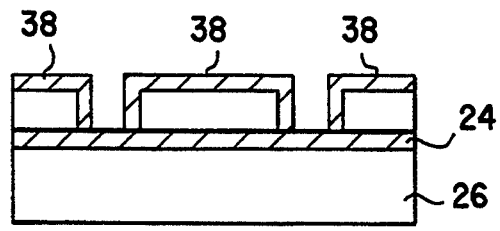
FIG.I(g)
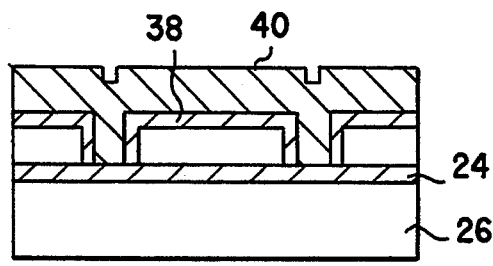
FIG.I(h)
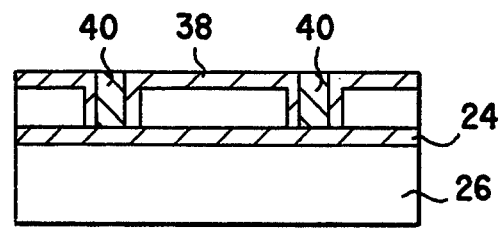
FIG.I(i)
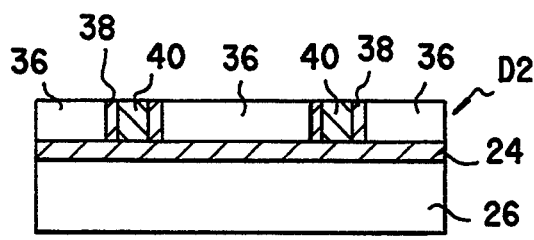
FIG.I(j)

DIELECTRICALLY ISOLATED SUBSTRATE AND A PROCESS FOR PRODUCING THE SAME

This is a divisional of application Ser. No. 07/762,990 filed Sep. 20, 1991 now abandoned.

BACKGROUND OF THE INVENTION

1. Field of the Invention

The present invention relates to substrates for use in integrated circuits and more particularly to a dielectrically isolated substrate of a bonding type having squared and maximized island regions. The invention further relates to a process for producing such a unique substrate.

2. Description of the Prior Art

In fabricating those substrates intended for use in integrated circuits for semiconductor devices, a p-n junction isolation technique using diffusion layers has been widely employed to isolate the individual elements of the substrate from each other. This isolation diffusion techniques is not only relatively simple in steps but easy in process control. However, it is susceptible to excessive isolation capacitances and poor high frequency characteristics and hence low operating speed in circuits. Alternatively, a dielectric isolation technique using dielectric layers has been proposed which is reputed as fully acceptable in parasitic capacitances and breakdown characteristics.

A dielectrically isolated substrate of a bonding type is known to be a substrate obtained by the last-mentioned dielectric isolation technique as disclosed for instance in Japanese Patent Laid-Open Publication No. 62-229855. This conventional substrate is produced as will be hereunder described with reference to FIGS. 13(a) through 13(j).

An N+ dopant such as of antimony (Sb), arsenic (Ar) or the like is buried and diffused to a mirror polished surface of a single crystal silicon substrate or bond substrate 2 with a (100) plane as the main crystal plane as shown in FIG. 13(a), followed by formation of a dielectric film 4 of silicon dioxide ($SiO_2$) over the surface of the bond substrate 2 as by thermal oxidation. The bond substrate 2 is contacted with another substrate or base substrate 6 with their mirror polished surface opposed to each other and thereafter bonded together into an integral structure 8 at above 200° C. as depicted in FIG. 13(b).

The substrate 2 of the structure 8 is ground and polished to a thickness of 30 to 50 $\mu$m [FIG. 13(c)], followed by formation of oxide film 10 of nearly 0.6 $\mu$m in thickness, for subsequent photo-lithography, over an outer surface of the substrate 2 as through thermal oxidation [FIG. 13(d)]. Small openings or windows 12 are formed photo-lithographically selectively in the oxide film 10 according to an isolation mask pattern [FIG. 13(e)], whereby the surface of the substrate 2 is anisotropically etched through the windows 12 into V-shaped isolation grooves or moats 14 so that island regions 16 are formed on both sides of each of the moats 14 [FIG. 13(f)]. An isolation oxide film 18 is then disposed in a thickness of about 2 $\mu$m and over both the islands and the moats [FIG. 13(g)]. Deposited over the oxide film 18 is a polycrystalline silicon layer 20 in a thickness of 40 to 80 $\mu$m [FIG. 13(h)], whereupon lapping is effected from toward the silicon layer 20 with the oxide film 18 being used as a stopper layer [FIG. 13(i)]. A dielectrically isolated substrate D1 is obtained by finally removing the oxide film 18 [FIGS. 13(j) and 14].

The above substrate of the prior art derivable from a single crystal silicon substrate with a (100) plane as the main crystal plane, is disadvantageous in that it is necessarily narrow in island area due to the corresponding V-shaped isolation moats. The island area becomes smaller as the substrate increases in thickness.

SUMMARY OF THE INVENTION

With the foregoing drawbacks of the prior art in view, the present invention seeks to provide a dielectrically isolated substrate for use in integrated circuits which exhibits increased integration with maximized island area, squared island surface and minimized surface loss. The invention also seeks to provide a process for the production of such a substrate.

Many other objects and advantages of the invention will be apparent from the following description with reference to the accompanying drawings.

In one aspect the invention provides a dielectrically isolated substrate for use in integrated circuits, which comprises a single crystal silicon bond substrate and a single crystal silicon base substrate integrally bonded to the bond substrate, the bond substrate including a plurality of discrete, vertical moats and a plurality of square islands each positioned contiguous to each of the moats.

In another aspect the invention provides a dielectrically isolated substrate for use in integrated circuits, which comprises a single crystal silicon bond substrate having a (110) plane as a main crystal plane, and a single crystal silicon base substrate integrally bonded to the bond substrate, the bond substrate including a plurality of discrete, vertical moats and a plurality of square islands each positioned contiguous to each of the moats, each of the moats being formed by the use of a mask pattern having two opposite pairs of rectangular members arranged in a square shape, one pair being smaller in width than the other, and meeting the following equation $$0 < X < l \tan 19.5°$$

where X is an end distance between the two respective adjacent members, and l is a width of each of the wide members.

In still another aspect, the invention provides a process for producing a dielectrically isolated substrate for use in integrated circuits, which comprises the steps of: (a) coating a single crystal silicon bond substrate with a dielectric film, bringing the junction substrate into intimate contact with a single crystal silicon base substrate and heat-treating the same into a composite structure; (b) polishing the composite structure on a front surface of the bond substrate to a thickness; (c) forming an oxide film for photo-lithography over the polished surface of the bond substrate; (d) photo-lithographing the oxide film selectively with use of a mask pattern to thereby open a plurality of windows; (e) etching the bond substrate through the windows to thereby form a plurality of moats terminating at the dielectric film and a plurality of islands each positioned contiguous to each of the moats; (f) coating a dielectric isolation film onto the bond substrate; (g) depositing a polycrystalline silicon layer in a thickness onto the dielectric isolation film; (h) lapping the polycrystalline silicon layer until the surface of each of the islands is exposed; and (i)

subsequently removing the dielectric isolation film, wherein the bond substrate has a (110) plane as a main crystal plane and is subjected to anisotropic etching under alkaline conditions whereby each of the moats has substantially vertical walls terminating at the dielectric film, and each of the islands has a cross-sectionally square shape.

BRIEF DESCRIPTION OF THE DRAWINGS

FIGS. 1(a) to 1(j) are diagrammatical cross-sectional views illustrative of the sequence of the process of fabricating a dielectrically isolated substrate according to the present invention;

DETAILED DESCRIPTION OF THE INVENTION

Figure 1A:
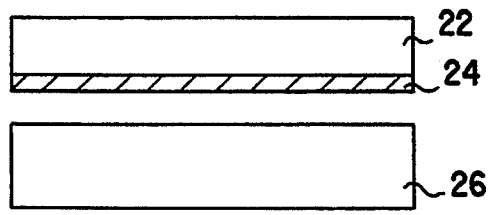

The process according to the present invention is comprised of several specific process steps described herein.

A bond substrate formed from a single crystal silicon and coated with a dielectric film is brought into contact with a base substrate from a single crystal silicon, and both substrates are heat-treated together into an integrally bonded structure. The resulting composite structure is polished on one surface to a specific thickness. Over the polished surface of the structure is coated an oxide film for being subsequently photo-lithographed. The oxide film is selectively removed by photo-lithography so as to match a given mask pattern, thereby defining small openings or windows. The bond substrate on its outer surface is etched through the windows, thus forming moats terminating at the above dielectric film and hence island regions standing in contiguous relation to the moats. The outer surface of the bond substrate thus etched is coated with a dielectric isolation film on which a polycrystalline silicon layer is deposited to a specific thickness. The silicon layer is lapped uniformly until the surface of each of the islands is exposed. The dielectric isolation film is finally removed.

One important feature of the process of the invention resides in using a single crystal silicon of a (110) plane as the main crystal plane for the bond substrate and also in anisotropically etching the bond substrate with an alkaline etchant. This specific etching contributes to the formation of discrete, vertical moats communicating with the dielectric film, leading to square islands of a large area.

To achieve the above mode of anisotropic etching, a mask pattern is positioned on the bond substrate. The mask pattern is of a substantially square shape having two pairs of two opposed sides, one pair extending vertically to a <111> orientation and the other to a <112> orientation. Preferably, one pair of sides vertical to the <111> orientation may be rectangular and great in width, while the other pair of sides vertical to the <112> orientation may be rectangular and small in width, all the sides being adequately distant. The distance between the two pairs of sides should meet the following equation.

$$0 < X < l \tan 19.5°$$

X: distance between an end of the pair of the sides vertical to the <111> orientation and the adjacent side of the pair of the sides vertical to the <112> orientation l: width of the pair of the sides wider in width vertical to the <111> orientation The parameter X is preferably as near to the parameter l as possible. Strict observance of this equation is responsible for an island region of maximized area.

The process of the invention contemplates the use of the inherent characteristics of anisotropic etching in which the etch rate varies with the crystal plane of a silicon material constituting the bond substrate. To this end, the bond substrate is anisotropically etched with the use of the mask pattern specified above and in the presence of an alkaline etchant such as for example aqueous potassium hydroxide (KOH).

At an opening of the mask pattern arranged vertically to the (111) orientation, the etch rate on the {111} planes is extremely low as against that on the {110} planes so that etching develops rapidly vertically or in the <110> orientation but hardly laterally or in the <111> orientation. Thus, on the bond substrate is formed a moat having walls of the (111) plane upstanding vertically with respect to the surface of the base substrate and corresponding substantially to the width of the mask pattern opening.

At an opening of the mask pattern disposed vertically to the <112> orientation, the etch rate on the (112) plane is 0.2 to 0.3 times that on the (110) plane. Etching progresses transversely or in the <112> orientation and at a speed of 0.2 to 0.3 times the etch rate in the vertical direction or <110> orientation. Disposed on the bond substrate is a moat having walls of the (112) plane vertical to the surface of the base substrate and corresponding substantially to the width of the mask pattern opening plus a width of 0.4 to 0.6 times the depth.

The two discrete, vertical moats formed above should not be contacted at their ends until such time that the final process step is performed. If these moats are placed in contacted relation to each other while in anisotropic etching, then excessive etching takes place in the moats at their corner portions and hence a square island cannot be formed. In the practice of the invention, the moats are not excessively etched owing to adjustment based on the distance and width of the mask pattern. This adjustment enables the moats to be smaller in width and thus the resultant islands to be larger in area without involving objectionable corner erosion. This further leads maximum effective areas and hence high integration of the bond substrate.

The following examples are given to further explain the invention. These examples should be regarded as illustrative but not restrictive of the invention.

With reference to the drawings and FIGS. 1(a) to 1(j) in particular, an N+ dopant such as of antimony (Sb), arsenic (Ar) or the like is buried and diffused to a mirror polished surface of a single crystal silicon substrate or bond substrate 22 of a (110) plane as the main crystal plane as shown in FIG. 1(a), followed by formation of a dielectric film 24 of silicon dioxide ($SiO_2$) over that surface of the bond substrate 22 as by thermal oxidation.

Importantly, the single crystal silicon bond substrate 22 has a (110) crystal plane in place of the prior art substrate of a (100) plane.

Figure 1B:
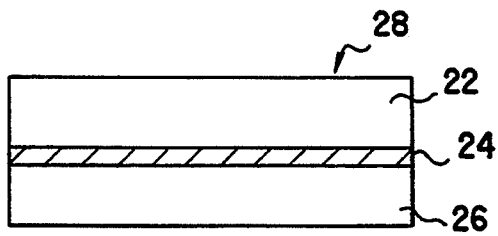
Figure 1C:
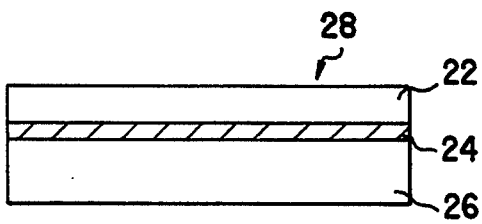
Figure 1D:
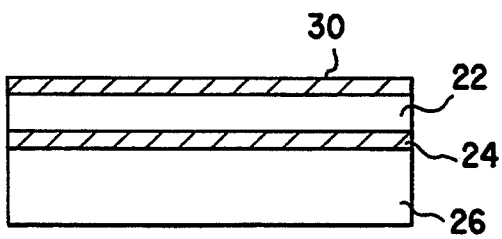
Figure 1E:
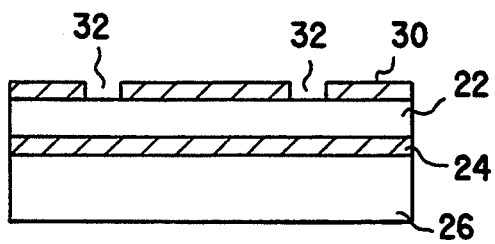
Figure 2:
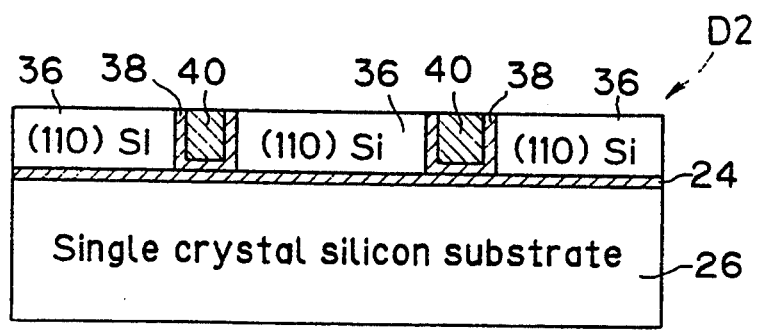
FIG. 2 is a view, enlarged segmentally and seen cross-sectionally, of the dielectrically isolated substrate provided in accordance with the invention.

The bond substrate 22 is contacted with another substrate or base substrate 26 with their mirror polished surface opposed to each other and thereafter bonded together into an integral structure 28 at above 200° C. as depicted in FIG. 1(b). The substrate 22 of the structure 28 is ground and polished to a thickness of 30 to 50 μm [FIG. 1(c)], followed by formation of an oxide film 30 of nearly 0.6 μm in thickness, for subsequent photo-lithography, over an outer surface of the substrate 22 as through thermal oxidation [FIG. 1(d)]. Small openings or windows 32 are formed photo-lithographically selectively in the oxide film 30 according to an isolation mask pattern [FIG. 1(e)], whereby the surface of the substrate 22 is anisotropically etched through the windows 32 into isolation grooves or moats 34 having substantially vertical walls so that island regions 36 are formed on both sides of each of the moats 34 [FIG. 1(f)]. An isolation oxide film 38 is then disposed in a thickness of about 2 μm and over both the islands and the moats [FIG. 1(g)]. Deposited over the oxide film 38 is a polycrystalline silicon layer 40 with a thickness of 40 to 80 μm [FIG. 1(h)], whereupon lapping is effected upon the silicon layer 40 with the oxide film 38 being used as a stopper layer [FIG. 1(i)]. A dielectrically isolated substrate D2 is obtained by finally removing the oxide film 38 [FIGS. 1(j) and 2].

According to the process of the invention, the vertically walled moats 34 can be formed by anisotropic etching with the resulting islands 36 being substantially square in shape and very large in area. The formation of such vertical moats permits a smaller width of the window 32 in contrast to the V-shaped recess of the prior art, resulting in greater effective areas of the bond substrate 22.

The process of the invention incorporates the following features.

Figure 3:
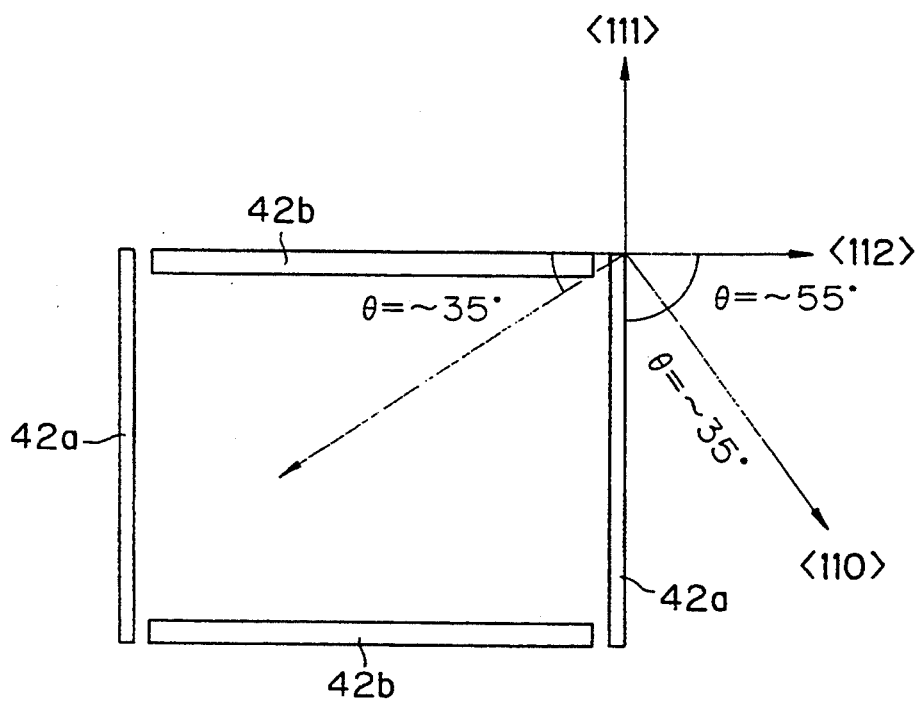
FIG. 3 is a view explanatory of the correlation between the mask pattern and the crystal plane.

On the (100) plane of the bond substrate 22, a pair of rectangular members 42a, 42a of small width and a pair of rectangular members 42b, 42b of large width are arranged substantially in a square shape and as the mask pattern. The members 42a, 42a are spaced apart as predetermined in parallel to the <111> orientation, whereas the members 42b, 42b are spaced apart as predetermined at right angles to the <111> orientation. The members 42a, 42a correspond to the <111> orientation and the members 42b, 42b to the <112> orientation as better seen from FIG. 3.

Figure 11A:
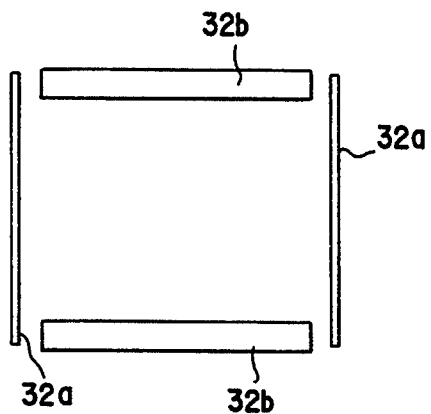
FIGS. 11(a) to 11(b) illustrate the case in which no island regions can be formed even with moats being formed by etching because the mask pattern is arranged too far at both ends, (a) showing a state before etching and (b) a state after etching.
Figure 11B:
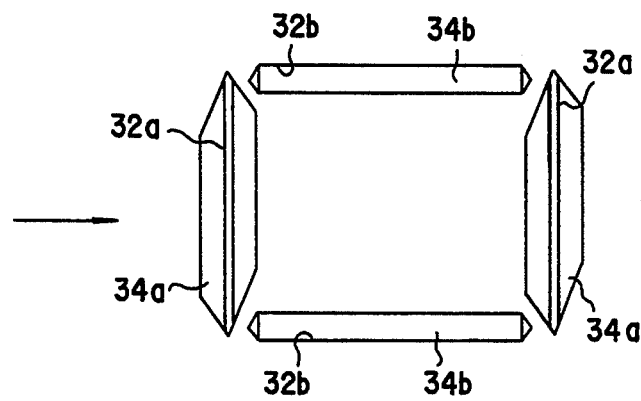
Figure 12A:
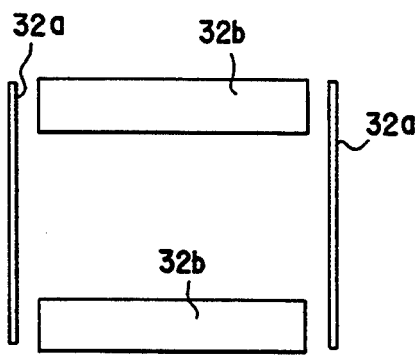
FIGS. 12(a) to 12(b) are views similar to FIG. 11 but illustrative of the case in which island regions can be formed as desired due to the mask pattern being disposed in correct posture, (a) being directed to an unetched state and (b) to an etched state.
Figure 12B:
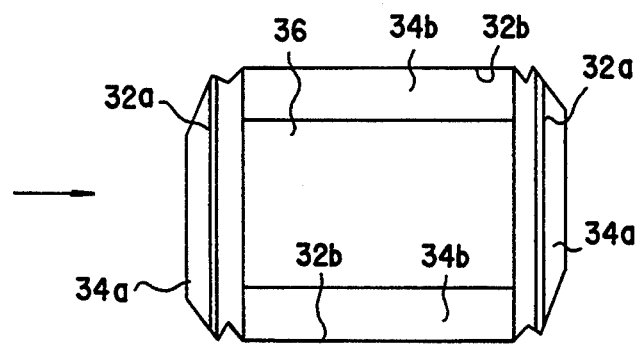
Figure 13A:
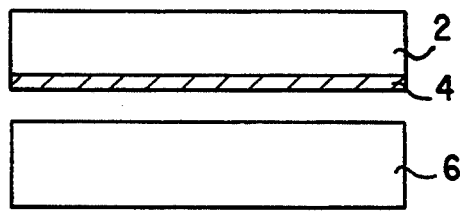
FIGS. 13(a) to 13(j) are cross-sectional views explanatory of the prior art method in sequence.
Figure 13B:
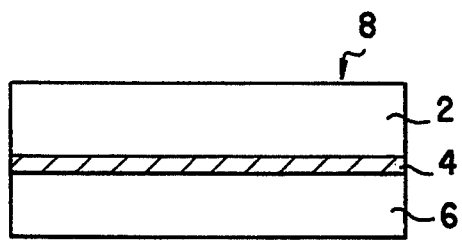
Figure 13C:
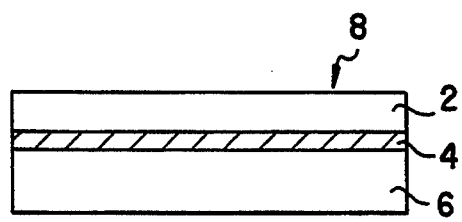
Figure 13D:
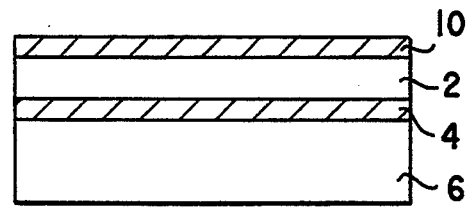
Figure 13E:
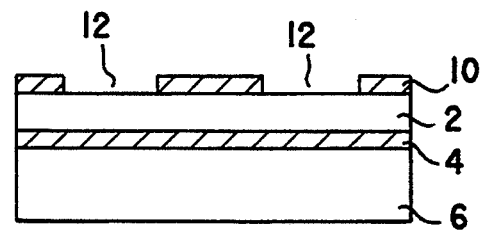
Figure 13F:
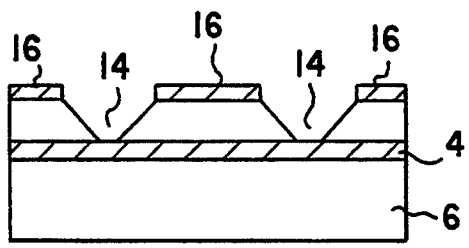
Figure 13G:
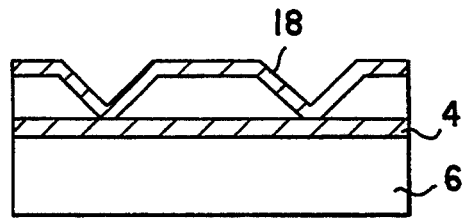
Figure 13H:
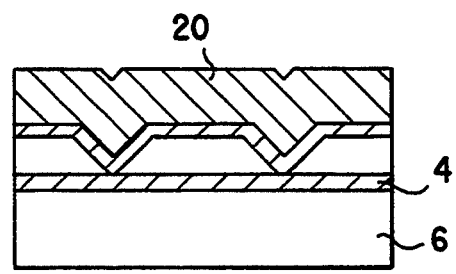
Figure 13I:
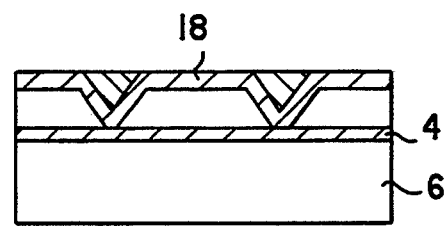
Figure 13J:
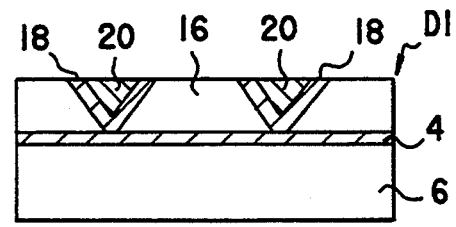

The (111) plane arranged vertically to the <111> orientation is positioned at right angles to the bond substrate 22. Anisotropic etching progresses by far more slowly on the (111) plane than on the (110) plane so that a moat 34b is formed on the (111) plane, and provided with a substantially vertical wall along a window 32b defined by the mask pattern members 42b, 42b as shown in FIGS. 11 and 12.

The (112) plane M vertical to the <112> orientation is likewise at right angles to the bond substrate 22. The etch rate on the (112) plane M is nearly 0.2 to 0.3 times that on the (110) plane. A moat 34a is formed also with a vertical wall but with a greater width than that of a window 32a defined by the members 42a, 42a (FIG. 4); that is, the width of the moat 34a is a sum of the window width and a width of 0.4 to 0.6 times the moat depth.

Figure 14:
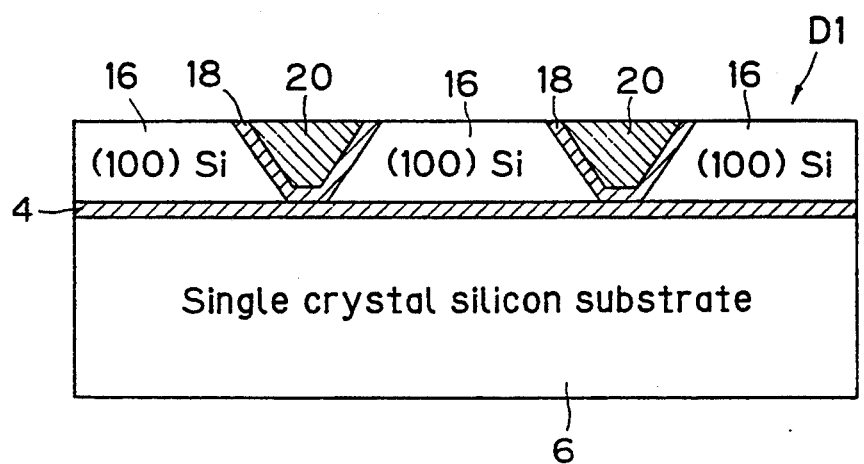
FIG. 14 is an enlarged cross-sectional view of the dielectrically isolated substrate according to the prior art method.

Turning now to FIGS. 13a to 13j, the (100) plane, single crystal silicon substrate 2 of the prior art has a greater width than its depth, say a balance of a square root of 2. This means that the invention differs substantially from the prior art. As is apparent from FIGS. 2 and 14, the structure D2 of the invention is incomparably larger in island area than the structure D1 of the prior art.

Figure 4:
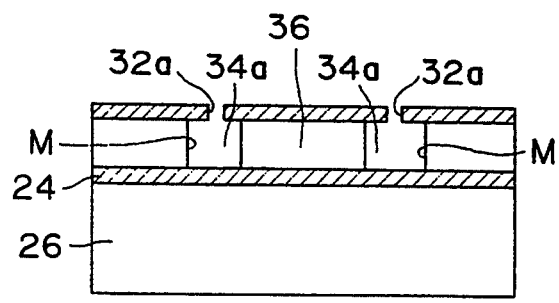
FIG. 4 is a cross-sectional view showing the substrate etched on and along the (112) plane.

The island region according to the invention is derived from forming the above noted moat by means of the above specified mask pattern. At the members 42b, 42b relative to the <112> orientation, the (111) plane of an extremely low etch rate is present in the transverse direction. Anisotropic etching gives the vertically walled moat 34b along the window 32b. At the members 42a, 42a corresponding to the <111> orientation, the (112) plane extends transversely. In this instance, etching is possible also along the width of the window 32a, whereby the moat 34a is formed with a greater width than the window width as stated above (FIG. 4). Arrangements of the mask pattern members 42a and 42b should be determined taking the etch rate along the width on the (112) plane in view. The members 42a and 42b when arranged too far away from each other at their opposite ends cannot be united even after etching so that no island is formed. Initial contact or nearer positioning of both members causes a square island to be excessively etched at its corner portions and rather rounded, leading to narrow effective areas of the island.

Figure 8:
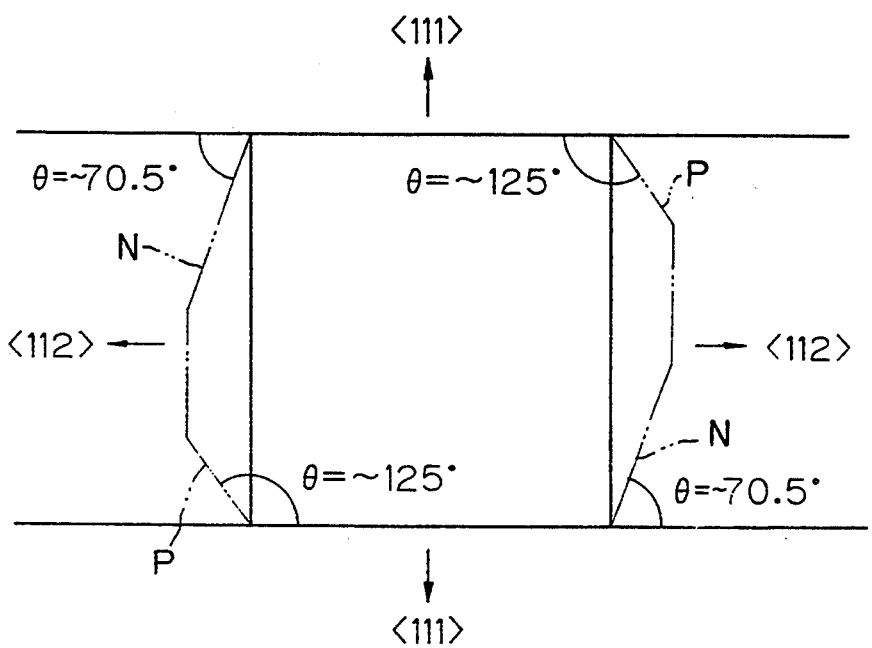
FIG. 8 is a crystalographic representation of the relationship between the (110) plane and the (111) plane.
Figure 9:
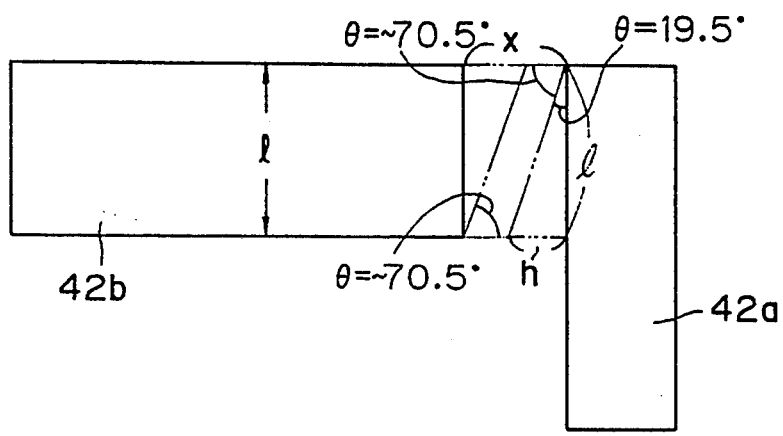
FIG. 9 is a view illustrating the (111) plane having been exposed during etching in the circle (a) of FIG. 5.
Figure 10:
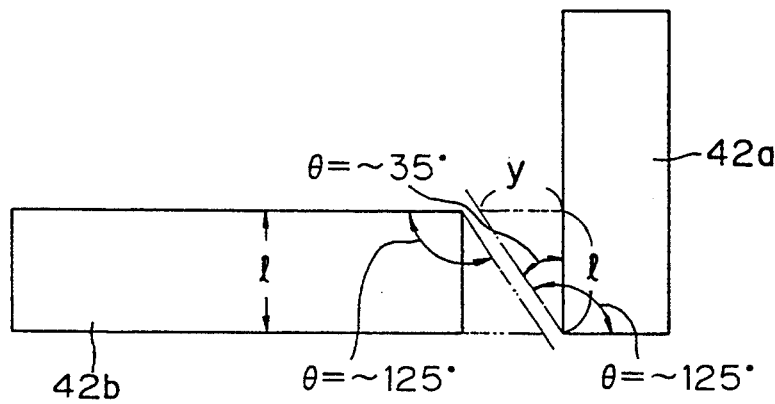
FIG. 10 is a view similar to FIG. 9 but showing the (111) plane having been exposed during etching in the circle (b) of FIG. 5.

As crystalographically illustrated in FIG. 8, a (111) plane N is present which is at an angle of about 70.5° to the (111) plane vertical to the (110) plane and at a right angle to the (110) plane. The (111) plane N develops upon alkaline etching for example with the addition of KOH, 50% by weight solution, at 80° C. and with the use of the mask pattern members 42a and 42b. Etching ceases continuing at the (111) plane N for its extremely small etch rate. The moats 34a and 34b, therefore, will in some cases fail to contact with each other depending upon the relationship between the width l of the member 42b and the end distance X of the members 42a and 42b (FIG. 11). Such failure will occur at the circle (a) in FIG. 5. If a right triangle is assumed with a height h and a base l, then the equation $h = l \tan 19.5°$ is obtained. When the end distance X is made smaller than the height h (namely; $X < l \tan 19.5°$), the moat 34a is brought into intimate contact with the moat 34b (FIG.

12). Since the etch rates of the (111) plane and the (112) plane are substantially definite at this stage, the end distance X is preferably nearer to the height h. In the case where X is equal to zero, etching is adversely excessive and hence X should be in excess of 0.

Figure 5:
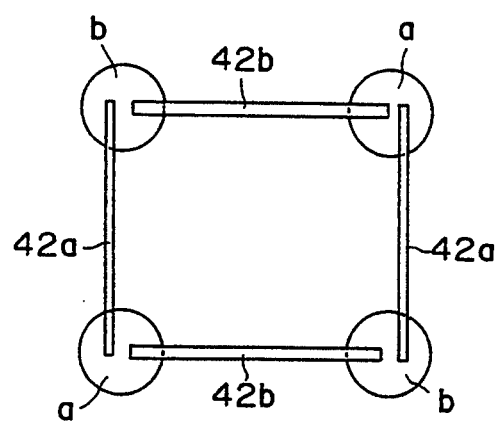
FIG. 5 is a plan view illustrating the manner in which the mask pattern is disposed.
Figure 6:
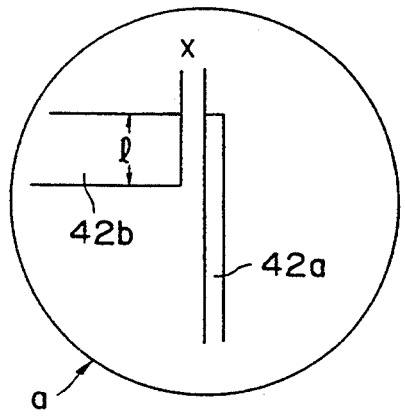
FIGS. 6 and 7 are enlarged plan views respectively of the circles (a) and (b) in FIG. 5.
Figure 7:
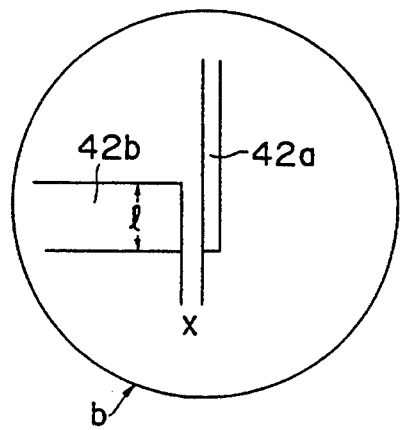

An inclined (111) plane P develops at the circle (b) of FIG. 5, which (111) plane is at angles of about 125° to the (111) plane vertical to the (110) main face and about 35° to the same (110) main face. Non-contact of the moats 34a and 34b will take place for the same reasoning as in the case of the circle (a) of FIG. 5 (FIG. 11). With a right triangle assumed with a height y and a base l, the equation y=l tan 35° is given. Smaller end distances X of the members 42a and 42b than the height y denote intimate contact of the moats 34a and 34b (FIG. 12). When the case of the circle (b) alone is considered, the end distance X might be smaller than the height y. To attain the desired island, however, the moats should be united at both the circles (a) and (b) in FIG. 5. The equation $X < l \tan 19.5°$ rather than $X < l \tan 35°$ is chosen to implement the invention.

What is claimed is:

1. A process for producing a dielectrically isolated substrate for use in integrated circuits, which comprise the steps of:
   (a) coating a single crystal bond substrate with a dielectric film, bringing the bond substrate, having a <110> plane be a main crystal plane, into intimate contact with a single crystal silicon base substrate and heat-treating the same into a composite structure;
   (b) polishing the composite structure on a front surface of said bond substrate to reduce its thickness;
   (c) forming an oxide film for photo-lithography over the polished surface of the bond substrate;
   (d) photo-lithographing the oxide film selectively with the use of a rectangular form mask pattern having two opposite pairs of rectangular members, a first pair being normal to the <111> orientation and a second pair being normal to the <112> orientation, wherein the first pair of members has a greater width than said second pair of members, to thereby open a plurality of windows;
   (e) anisotropically etching the bond substrate through said windows under alkaline conditions sufficient to thereby form a plurality of substantially rectangular cross-section moats terminating at the dielectric film and a plurality of islands each positioned contiguous to each of the moats wherein the walls of said islands are substantially normal to said dielectric film;
   (f) coating a dielectric isolation film onto the bond substrate;
   (g) depositing a polycrystalline silicon layer in a thickness greater than the depth of said moats onto the dielectric isolation film;
   (h) lapping the polycrystalline silicon layer until the surface of each of the islands is exposed; and
   (i) subsequently removing the dielectric isolation film from the surface of said islands to form islands of a substantially rectangular cross-section shape.

2. The process according to claim 1 wherein said mask pattern members meet the following equation:

$$0 < X < l \tan 19.5°$$

where X is an end distance between two respective adjacent members, and l is a width of each of the first members.

3. A dielectric isolated substrate for use in integrated circuits, which incorporates a single crystal silicon bond substrate having a <110> plane as a main crystal plane and a single crystal base substrate integrally bonded to the bond substrate, the bond substrate including a plurality of discrete moats having side walls which are substantially normal to the bottom of said moats and a plurality of substantially rectangular islands each positioned contiguous to each of the moats, said dielectric isolated substrate being formed by a process comprising the steps of:
   coating a single crystal silicon bond substrate with a dielectric film, bringing dielectric coating on the bond substrate into intimate contact with a single crystal silicon base substrate and heat-treating the bond substrate, dielectric coating, and base substrate into a composite structure;
   reducing the thickness of the composite structure by polishing off a portion of said bond substrate remote from said dielectric coating;
   forming an oxide film over the polished surface of the bond substrate;
   selecting a mask pattern having a first pair of opposing members normal to the <111> orientation, and a second pair of opposing members positioned normal to a <112> orientation, wherein said first pair of members have a greater width than said second pair of members;
   photo-lithographing the oxide film selectively with use of the mask pattern selected to thereby open a plurality of windows;
   etching the bond substrate through the windows to thereby form a plurality of moats terminating at the dielectric film and a plurality of islands each positioned contiguous to each of the moats, each of the plurality of windows being defined by two opposing pairs of rectangular members of the mask pattern whereby each of the islands is formed in a rectangular shape;
   coating a dielectric isolation film onto the bond substrate;
   depositing a polycrystalline silicon layer onto the dielectric isolation film; and
   removing so much of said polycrystalline silicon layer as will expose a surface of each of the islands.

4. A dielectrically isolated substrate for use in integrated circuits according to claim 3, wherein said step of selecting the mask pattern further includes selecting the first and second pairs of members so as to meet the following equation $$0 < X < l \tan 19.5°$$

where X is an end distance between two respective adjacent members, and l is a width of each of the first pair of members.

5. A method for fabricating a dielectrically isolated substrate for use in integrated circuits, which incorporates a single crystal silicon bond substrate having a <110> plane as a main crystal plane and a single crystal silicon base substrate integrally bonded to the bond substrate, the bond substrate including a plurality of discrete, moats of substantially rectangular cross-section and a plurality of substantially rectangular islands each positioned contiguous to each of the moats, said dielectrically isolated substrate being formed from the method comprising the steps of:

coating a single crystal silicon bond substrate with a dielectric film, bringing the dielectric coating on said bond substrate into intimate contact with a single crystal silicon base substrate and heat-treating the bond substrate, dielectric film coating and base substrate into a composite structure;

removing a portion at said bond substrate remote from said dielectric film coating;

forming an oxide film over the surface of the bond substrate remote from said dielectric film coating;

selecting a mask pattern having a first pair of opposing members being positioned normal to a <111> orientation, and a second pair of opposing members being positioned normal to a <112> orientation, said selecting of the mask pattern including the step of selecting each of the first pair of members normal to the <111> orientation to have a greater width than each of the second pair of members normal to the <112> orientation and selecting each of the first and second pairs of members to meet the following equation:

$$0 < X < l \tan 19.5°$$

where X is an end distance between two respective adjacent members, and l is a width of each of the first pair of members;

photo-lithographing the oxide film selectively with use of the mask pattern selected to thereby open a plurality of windows;

etching the bond substrate through the windows to thereby form a plurality of moats terminating at the dielectric film and a plurality of islands each positioned contiguous to each of the moats, each of the plurality of moats being defined by the two opposing pairs of substantially rectangular recesses arranged to form each of the plurality of islands in a rectangular shape, each of the rectangular recesses having substantially uniform widths relative to each other and being substantially normal to a base of said moats;

coating a dielectric isolation film onto an exposed surface of the bond substrate;

depositing a polycrystalline silicon layer onto the dielectric isolation film; and removing so much of said polycrystalline silicon layer as to expose a surface of each of the islands.

* * * * *